(12) United States Patent
Fong et al.

(10) Patent No.: US 6,294,811 B1
(45) Date of Patent: *Sep. 25, 2001

(54) TWO TRANSISTOR EEPROM CELL

(75) Inventors: Steven J. Fong, Santa Clara; Xiao-Yu Li, San Jose, both of CA (US)

(73) Assignee: Vantis Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/245,813

(22) Filed: Feb. 5, 1999

(51) Int. Cl.$^7$ .................................................. H01L 29/788
(52) U.S. Cl. .................... 257/321; 257/314; 257/315; 257/316; 257/318; 438/259; 438/264
(58) Field of Search ........................................ 438/259, 264, 438/291, 594; 257/321, 315, 314, 316, 318

(56) References Cited

U.S. PATENT DOCUMENTS

| | | |
|---|---|---|
| 4,037,242 | 7/1977 | Gosney . |
| 4,715,014 | 12/1987 | Tuvell et al. . |
| 4,924,278 | 5/1990 | Logie .................................. 357/23.5 |
| 5,440,159 | 8/1995 | Larsen et al. . |
| 5,457,652 | 10/1995 | Brahmbhatt . |
| 5,487,033 | 1/1996 | Keeney et al. . |
| 5,491,657 | 2/1996 | Haddad et al. . |
| 5,504,706 | 4/1996 | D'Arrigo et al. . |
| 5,587,945 | 12/1996 | Lin et al. . |
| 5,596,524 | 1/1997 | Lin et al. . |
| 5,615,150 | 3/1997 | Lin et al. . |
| 5,615,152 | 3/1997 | Bergemont . |
| 5,640,346 | 6/1997 | Preslar . |
| 5,646,901 | 7/1997 | Sharpe-Geisler et al. . |
| 5,742,542 | 4/1998 | Lin et al. . |
| 5,761,116 | 6/1998 | Li et al. . |
| 5,872,732 | 2/1999 | Wong et al. . |
| 5,886,378 | 3/1999 | Wang . |
| 5,942,780 | 8/1999 | Barsan et al. . |
| 5,969,992 | 10/1999 | Mehta et al. . |
| 5,999,449 | * 12/1999 | Mehta et al. ..................... 365/185.05 |
| 6,157,568 | * 1/2001 | Schmidt ............................. 365/185.1 |
| 6,172,392 | * 1/2001 | Schmidt et al. ..................... 257/315 |

FOREIGN PATENT DOCUMENTS

| | | |
|---|---|---|
| 0 295 935 | 12/1988 | (EP) . |
| 0 493 640 | 7/1992 | (EP) . |
| 0 776 049 | 5/1997 | (EP) . |
| 10223782 | 8/1998 | (JP) . |
| 96 21273 | 7/1996 | (WO) . |
| 98 19343 | 5/1998 | (WO) . |

\* cited by examiner

*Primary Examiner*—Matthew Smith
*Assistant Examiner*—V. Yevsikov
(74) *Attorney, Agent, or Firm*—Fliesler Dubb Meyer & Lovejoy LLP

(57) ABSTRACT

A two transistor EEPROM cell is described that is erased by electron tunneling across an entire portion of a tunneling channel and programmed by electron tunneling at an edge of a tunneling drain.

19 Claims, 2 Drawing Sheets

TWO TRANSISTOR EEPROM CELL

BACKGROUND OF THE INVENTION

1. Field of the Invention

This invention relates generally to semiconductor devices, and more particularly, to an electrically erasable programmable read only memory ("EEPROM") cell.

2. Description of Related Art

The semiconductor community faces increasingly difficult challenges as it moves into production of semiconductor devices at feature sizes approaching 0.1 micron. Cell designs for typical semiconductor devices must be made more reliable, scalable, cost effective to manufacture and able to operate at lower power in order for manufacturers to compete in the semiconductor industry. EEPROM devices are one such device that must meet these challenges.

EEPROM devices are generally known as read-only memory in which the memory cells that store information may be erased and reprogrammed electrically. An EEPROM cell is typically made up of three separate transistors, namely, a write transistor, a sense transistor and a read transistor. The EEPROM cell is able to be programmed, erased and read by removing or adding electrons to a floating gate. Thus, in one example, the floating gate is programmed by removing free electrons from the floating gate and thereby giving the floating gate a positive charge. When it is desired to erase the EEPROM cell in this example, the floating gate is given a net negative charge by injecting electrons onto the floating gate. The read operation is performed by reading the state (current) of the sense transistor. In order to give the floating gate a positive charge (program) or negative charge (erase), electron tunneling, for example using the well-known Fowler-Nordheim tunneling technique, may be performed by applying the appropriate voltage potentials between the floating gate and a region, such as a drain region, of a transistor. Upon applying the appropriate voltage potentials, electron tunneling occurs through a tunnel oxide layer between the floating gate and the region.

As the feature sizes of EEPROM cells are scaled downward, the prior art EEPROM cells exhibit certain scaleablity, cost and reliability limitations. First, since three transistors (write, sense and read) form the typical EEPROM cell, the size of the EEPROM cell is large. Also, with a three-transistor cell, three oxide layers (typically two gate oxide layers and one tunnel oxide layer) are needed that may vary in thicknesses requiring complex process steps to form the oxide layers of varying thicknesses. Second, the manufacturing process for a smaller EEPROM cell becomes more complex and, accordingly, manufacturing costs rise as transistor channel lengths are reduced. For example, as the channel length of a transistor of the EEPROM cell is scaled downward, the thickness of the gate oxide overlying the channel must also be reduced since the gate oxide thickness must be scaled with the channel length. In view of the fact that EEPROM cells already have a complex process to form multiple oxide thicknesses, additional oxide thicknesses for the transistors would add additional steps to further complicate the manufacturing process and thereby increase manufacturing costs.

In addition to this scaling problem, reliability problems also exist with previous EEPROM cells. First, the EEPROM cell is typically both programmed and erased through one tunnel oxide window of a transistor region that may deteriorate the cell quickly. In general, the tunnel oxide window deteriorates after tens of thousands of program/erase cycles and that deterioration cycle is shortened by only using the tunnel oxide window for both programming and erasing operations. Thus, the use of the window for both programming and erasing of the EEPROM cell causes the cell to be significantly less reliable. A further reliability limitation of previous EEPROM cells is that the tunnel oxide window is less reliable because it is formed over a highly doped program junction (PRJ). The high doping concentration of the PRJ degrades the surface immediately above the PRJ and thereby reduces the EEPROM cell's reliability. A still further limitation of the EEPROM cell is that the voltages needed to program, erase and read the cell are high due to the relatively large feature sizes of the cell. Thus, in order to achieve lower voltages to operate the EEPROM cell, feature sizes of the cell must be scaled downward.

Thus, a need exists for a redesigned EEPROM cell that (1) does not add costly steps to the manufacturing process, (2) does not suffer from reliability problems caused by both programing and erasing through one tunnel oxide window, (3) does not deteriorate through use of a PRJ oxide and (4) operates at a lower power by using smaller feature sizes.

SUMMARY OF THE INVENTION

A two transistor EEPROM cell is described that is erased by electron tunneling across an entire portion of a tunneling channel and programmed by electron tunneling at an edge of a tunneling drain. The EEPROM cell has two transistors formed in a semiconductor substrate: a tunneling transistor and a read transistor. The tunneling transistor has a tunneling source, a tunneling drain, and a tunneling channel between the tunneling source and the tunneling drain. The tunneling source and the tunneling drain have a second conductivity type that is opposite the first conductivity type of the semiconductor substrate. A tunnel oxide layer is formed over the tunneling channel, the tunneling source and the tunneling drain. A program junction region having the second conductivity type is formed in the semiconductor substrate and is separated from the tunneling transistor by a field oxide region. The read transistor, also formed in the semiconductor substrate, is electrically connected to the tunneling transistor through the tunneling drain. A floating gate overlies the tunnel oxide layer and the program junction oxide layer. Electron tunneling occurs through the tunnel oxide layer overlying an edge of the tunneling drain upon incurrence of a sufficient voltage potential between the floating gate and the tunneling drain to program the EEPROM cell. Electron tunneling also occurs through the tunnel oxide layer overlying the tunneling channel upon incurrence of a sufficient voltage potential between the floating gate and the tunneling channel to erase the EEPROM cell.

The EEPROM cell is a two transistor cell which is smaller than previous three transistor cells. The EEPROM cell of the present invention provides electron tunneling through the tunnel oxide layer overlying the tunneling channel to occur across the entire portion of the tunneling channel to erase the EEPROM cell, thereby increasing the EEPROM cell reliability. Also, the EEPROM cell is programmed by electron tunneling through the tunnel oxide layer overlying an edge of the tunneling drain, while the erase operation is performed across a tunnel channel. Thus, the programming and erasing operations are separated across different regions (edge of the tunneling drain and the entire tunneling channel) which increases the EEPROM cell's reliability. The EEPROM cell further has reduced thicknesses for the tunnel oxide layer and the program junction oxide layer to improve scaleablity and reduce operating voltages of the EEPROM cell of the present invention. The EEPROM cell further has a reduced third oxide thickness in the periphery of an integrated circuit containing the EEPROM cell of the present invention that further lowers the voltages needed to operate the integrated circuit.

BRIEF DESCRIPTION OF THE DRAWINGS

A better understanding of the present invention can be obtained when the following detailed description of a preferred embodiment is considered in conjunction with the following drawings, in which.

Figure 1:
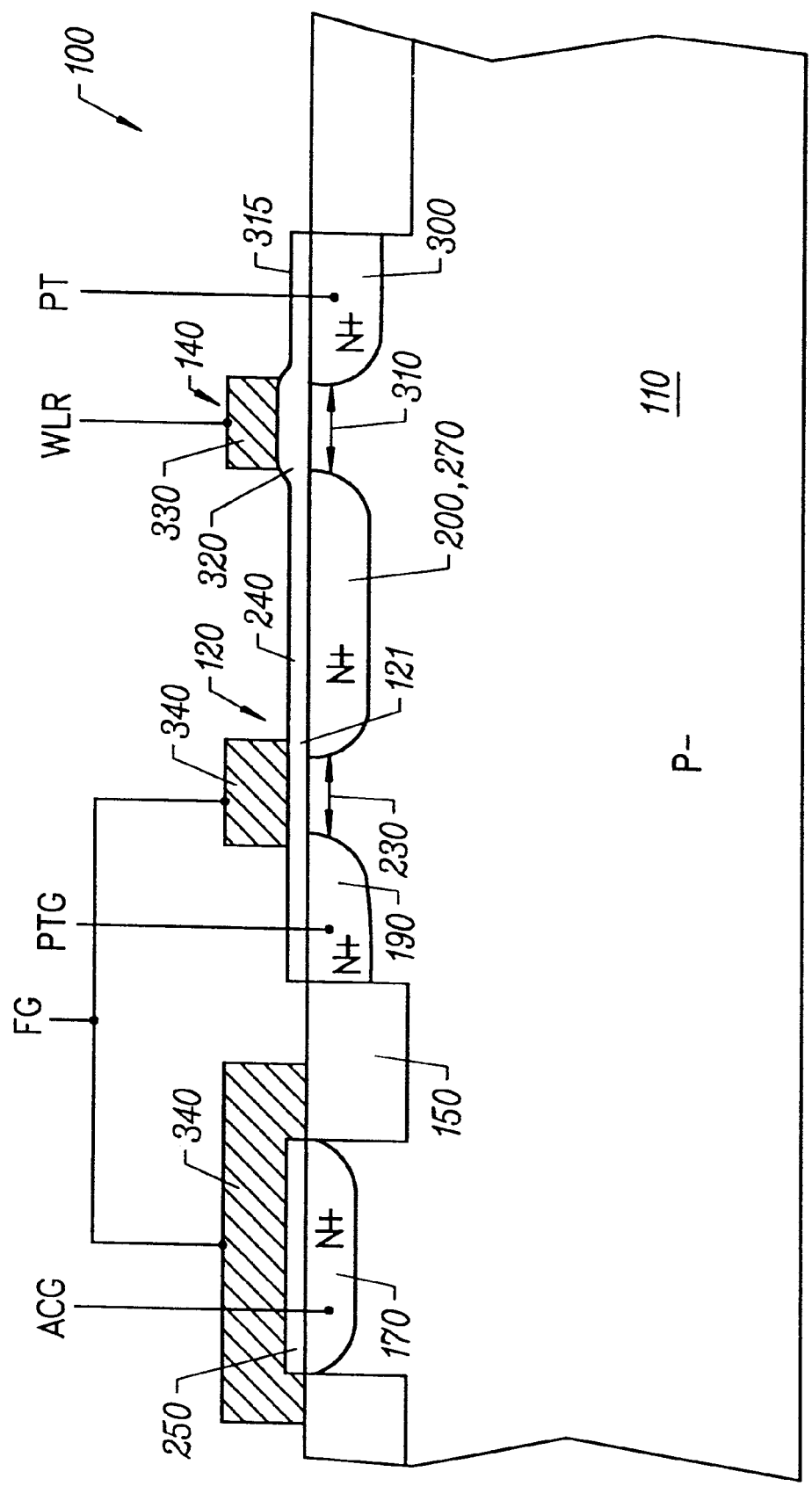
FIG. 1 is a cross-sectional view of an embodiment of the EEPROM cell of the present invention.

It will be appreciated that for simplicity and clarity of illustration, elements illustrated in the drawings have not necessarily been drawn to scale. For example, the dimensions of some of the elements are exaggerated relative to other elements for purposes of clarity. Further, where considered appropriate, reference numerals have been repeated among the drawings to represent corresponding or analogous elements.

DETAILED DESCRIPTION

Alternative embodiments of the EEPROM cell of the present invention are described below, along with the general process for manufacturing those embodiments. The operation of those embodiments is then provided in Table 1 and described in detail to explain the programming, erasing and reading functions of the embodiment of the EEPROM cell of the present invention.

FIG. 1 is a cross-sectional view of an embodiment of the EEPROM cell of the present invention. In FIG. 1, the embodiment of the EEPROM cell 100 is formed on a semiconductor substrate 110, for example a silicon substrate, and has a first conductivity type, for example, a P conductivity type. In one embodiment, the semiconductor substrate is a bulk substrate being entirely formed of a P conductivity type material. In another embodiment, the semiconductor substrate is formed of a P conductivity type material having an epitaxial layer on a top surface where the epitaxial layer is formed of an P conductivity type material. The P and N conductivity type materials (known as dopants) are those materials commonly known in the art that alter the conductivity of a semiconductor material by contributing either a hole (P type) or an electron (N type) to the conduction process. For silicon substrates, the dopants are generally found in Groups III and V of the well-known chemical periodic table. In alternative embodiments, the semiconductor substrate 110 may be alternative silicon materials well-known in the semiconductor industry such as germanium, germanium/silicon, gallium arsenide, polysilicon, silicon on insulator or the like. The EEPROM cell 100 has two separate transistors formed in the semiconductor substrate 110, namely, a tunneling transistor 120 and a read transistor 140. A program junction region 170 is also formed in the semiconductor substrate 110 and is electrically separated from the tunneling transistor 120 by a field oxide region 150, e.g. silicon dioxide, also formed in the semiconductor substrate 110. The program junction region 170 has an N conductivity type, such as an N+ conductivity type, and is a highly doped N+ region.

Returning to the tunneling transistor 120, the tunneling transistor 120 has a tunneling source 190 and a tunneling drain 200. The program junction region 170 acts as the control gate of the EEPROM cell 100 and is used to couple a high voltage onto the floating gate 340 to operate the EEPROM cell 100. The tunneling source 190 and tunneling drain 200 have the second conductivity type, e.g. a N+ type conductivity. The tunneling transistor 120 is therefore an NMOS transistor in this embodiment. A tunneling channel 230 is formed in the semiconductor substrate 110 between the tunneling source 190 and tunneling drain 200. Overlying the tunneling source 190, the tunneling channel 230 and the tunneling drain 200 is a tunnel oxide layer 240. The tunnel oxide layer 240 is typically composed of an insulating material, such as silicon dioxide, and has a thickness in the range of 70–90 angstroms, and, in one embodiment, is approximately 80 angstroms. It is noted that such a thickness for the tunnel oxide layer 240 is considerably less than the approximate 150 angstroms or greater used in prior art devices and therefore the EEPROM cell is smaller and requires less power to operate. An edge 121 of the tunneling drain 200 is used to perform electron tunneling to operate the EEPROM cell as described below. Overlying the program junction region 170 is a program junction oxide layer 250 that is composed of an insulating material, such as silicon dioxide. The program junction oxide layer 250 has a thickness of approximately 96 angstroms, which is also an improvement over prior art devices that had thicknesses greater than 180 angstroms. It is noted that while the thickness of the tunnel oxide layer 240 is 80 angstroms and the thickness of the program junction oxide layer is 96 angstroms, both layers may be formed (using conventional oxide growth techniques) in a single process step. This is because the program junction oxide layer 250 is grown on a highly doped N+ program junction region 170 that characteristically, as is well known to one skilled in the art, "expands" the thickness of the program junction oxide layer 250 to 96 angstroms, while the tunnel oxide layer 240, overlying the N+ type tunneling source 190 and the N+ type tunneling drain 200, remains at 80 angstroms since the N+ source 190 and drain 200 regions are formed subsequent to the oxidation. Thus, additional process steps, to form oxide layers with different thicknesses, are avoided. It is understood, however, that in another embodiment, the program oxide junction layer may be formed using other conventional techniques that form the oxides at the necessary thicknesses.

The read transistor 140 shares the tunneling drain 200 with the tunneling transistor 120 which acts as the read source 270. The read transistor 140 also has a read drain 300 that has the second conductivity type, e.g. an N+ conductivity type. Overlying the read drain 300 is a read drain oxide 315 layer that is composed of an insulating material, such a silicon dioxide, and has an approximate thickness of 80 angstroms. The read drain oxide layer 315 is formed in the same step as the tunnel oxide layer 240 and the program junction oxide layer 250. Between the read source 270 and the read drain 300 is a read channel 310. Overlying the read channel 310 is a read gate oxide layer 320 that has a thickness of approximately 150 angstroms and is composed of an insulating material, such as silicon dioxide. The formation of the read gate oxide layer 320, as described in detail below, requires additional separate process steps than the oxide layers 240, 250 and 315 since the thickness of the read gate oxide layer 320 is considerably more than the others. A read gate 330 overlies the read gate oxide layer 320 and is composed of a conducting material, such as a polycrystalline silicon material. A floating gate 340 overlies the tunnel oxide layer 240 overlying the tunneling channel 230 of the tunneling transistor 120 and also overlies the program junction oxide layer 250. The floating gate 340 is also formed of a conducting material, such as a polycrystalline silicon material since the floating gate is formed during the same step as forming the read gate 330. Depending on the mode of tunneling transistor 120 (depletion or enhancement mode), the relevant voltages for operating the EEPROM cell 100 are adjusted. The tunneling transistor 120 is, in one embodiment, a depletion mode transistor, as is commonly understood in the industry. In a further embodiment, the tunneling transistor 120 is an enhancement mode transistor (also as commonly known in the industry).

The transistors 120,140 of the EEPROM 100 are electrically connected to certain electrical lines and gates in order to operate and control the functions of the EEPROM cell 100. As shown in FIG. 1, an Array Control Ground (ACG) is electrically connected to the program junction region 170 while a Product Term Ground (PTG) is electrically connected to the tunneling source 190 of the tunneling transistor 120. A Word Line Read (WLR) is electrically connected to the read gate 330 of the read transistor 140 and a Product Term (PT) is electrically connected to the read drain 300. It is understood that electrical connecting includes any manner of transmitting charge between the two items being connected.

The method of manufacturing the EEPROM cell 100 of FIG. 1 includes standard deposition and etching techniques for forming the EEPROM cell 100 shown in FIG. 1. For example, in one embodiment, the EEPROM cell 100 is formed as follows. The semiconductor substrate 110, which may have an epitaxial layer (not shown) on the top surface of the semiconductor substrate 110, is patterned and etched (using conventional techniques) to form a deep trench in the semiconductor substrate 110 for the field oxide region 150. The tunnel oxide layer 240, the program junction oxide layer 250 and the read oxide layer 315 are then formed using common deposition or oxide growing techniques. In one embodiment, these layers are formed as follows. An oxide layer is grown across the entire semiconductor substrate having an approximate thickness of about 70 angstroms. Using conventional patterning techniques, the 70 angstrom oxide layer is removed except for the area overlying the read channel 310. A second oxide layer having a thickness of approximately 60 angstroms is then formed over the oxide layer and the semiconductor surface overlying the read channel 310. At this point, an approximately 60 angstrom oxide layer overlies the entire semiconductor substrate 110, except for the area overlying the read channel 310 which has a second oxide layer of approximately 130 angstroms due to the combination of the two oxide layers(60 angstroms and 70 angstroms). The periphery of an integrated circuit (not shown) containing the EEPROM cell 100 is then etched to remove the 60 angstrom second oxide and then a third oxide layer having a thickness of approximately 35 angstroms is grown. Now, the periphery of the integrated circuit has an approximately 35 angstrom thick oxide, the read gate oxide layer has an approximate thickness of 150 angstroms (combination of 130 angstroms and 35 angstroms) and the program junction oxide layer 250, tunnel oxide layer 240 and the read oxide layer 315 have an approximate thickness of 80 angstroms (combination of 60 angstrom and 35 angstrom layers). After these oxide layers have been formed, the gates 340,330 for the transistors 120,140, including the floating gate 340, are formed and patterned using conventional techniques. The gates are typically formed of a conducting material, e.g. a polycrystalline silicon material. Next, the source and drain implants are formed for each transistor 120 and 140 and standard back end (as is commonly known to those skilled in the art) is performed. It is understood that a plurality of EEPROM cells are manufactured into an EEPROM device in order to store a multitude of information. The EEPROM cell 100 of FIG. 1 further includes numerous metallization layers (not shown) overlying the cell 100 to electrically connect the cell 100 to other cells and other devices in an EEPROM device, as well as passivation layers (not shown) to protect the cell 100.

The three operations of the EEPROM cell 100 are program, erase and read. The various voltages applied to the EEPROM cell to perform these operations are shown in Table 1 below.

TABLE 1

|  | ACG | PTG | WLR | PT |
|---|---|---|---|---|
| Program | ground | HiZ | $V_{pp}+$ | $V_{pp}$ |
| Erase | $V_{pp}$ | ground | $V_{cc}$ | ground |
| Read (Depletion Mode) | ground | ground | $V_{cc}$ | $V_{cc}$ |
| Read (Enhancement Mode) | $V_{cc}$ | ground | $V_{cc}$ | $V_{cc}$ |

The erase operation of the EEPROM cell 100 of FIG. 1 is defined, for this embodiment, as providing a net negative charge on the floating gate 340. For the program operation, a positive charge is provided on the floating gate 340. It is understood, however, that alternative embodiments may deviate from this definition, yet fall within the scope of the present invention as claimed below. That is, the erase operation may put a negative charge on the floating gate 340 as long as the program operation puts the opposite charge (positive) on the erase operation. Thus, alternative embodiments may create potentials between the floating gate 340 and the appropriate channels that provide a net negative charge on the floating gate 340 to erase the EEPROM cell 100 of FIG. 1 and provide a positive charge on the floating gate 340 to program the EEPROM cell 100. Again, the erase operation is merely the consistent opposite of the program operation. In a further embodiment, the difference in charge level may differentiate between a program and erase operation. Thus, by increasing a charge to a sufficient level, the operation may change from a program operation to an erase operation, or vice versa.

In order to erase the EEPROM cell 100 of FIG. 1, in one embodiment, the floating gate 340 is given a negative charge by moving electrons to the floating gate 340. The method of moving electrons to the floating gate 340 is commonly known to those skilled in the art as Fowler-Nordheim tunneling. In general, this process has electrons tunnel through a barrier, for example a thin oxide layer, in the presence of a high electric field. However, unlike previous EEPROM cells that performed the electron tunneling through one oxide window at the edge of a drain region, the present invention provides for electron tunneling through the tunnel oxide layer 240 across the entire tunneling channel 230 to erase the EEPROM cell 100 and the edge 121 of the tunneling drain 200 to program the EEPROM cell. Further, the entire portion of the tunneling channel 230 is used for electron tunneling to erase the EEPROM cell 100. The advantages of such electron tunneling are described below.

In one embodiment, erasing of the EEPROM cell 100 of FIG. 1 is performed by moving electrons to the floating gate 340 through the tunnel oxide layer 240 and across the entire portion of the tunneling channel 230. It is understood that the entire portion of the tunneling channel 230 means the distance between the tunneling source 190 and the tunneling drain 200 underlying the tunnel oxide layer 240. In order to move the electrons to floating gate 340 to erase the EEPROM cell 100, $V_{pp}$, for example 12 volts, is applied to ACG. Since the program junction region 170 is capacitively coupled to the floating gate 340 through the program junction oxide layer 250, approximately 10 volts is placed on the floating gate 340. PTG and PT are grounded while WLR is set to $V_{cc}$, for example 3.3 volts. Since the floating gate 340 is at a high voltage and the tunneling source 190 is grounded as well as the substrate 110, a potential is created between the floating gate 340 and the tunneling channel 230. The tunnel oxide layer 240 immediately above the tunneling channel 230 has a thickness of approximately 80 angstroms, in one embodiment, so that electron tunneling occurs across the entire portion of the tunneling channel 230 and through the tunnel oxide layer 240 since the programming voltages previously mentioned provide a sufficient voltage potential between the floating gate 340 and the tunneling channel 230. The voltages provided in this embodiment may vary in alternative embodiments as long as a sufficient potential is created to move electrons through the tunnel oxide layer 240 onto the floating gate 340 across the tunneling channel 230. Likewise, the oxide layer thicknesses, of all oxide layers used for electron tunneling, may also vary as long as the thickness is sufficient to permit electron tunneling at the disclosed potentials.

To program the floating gate 340, in this same embodiment, electrons are removed from the floating gate 340 through the tunnel oxide layer 240 at the edge 121 of the tunnel drain 200 to give the floating gate 340 a positive charge. To program the EEPROM cell 100, $V_{pp}$, for example 10 volts, is applied to PT, $V_{pp}$+, e.g. 12 volts, is applied to WLR, while PTG is set to a floating voltage (HiZ). That is, PTG is not connected to a voltage or ground and therefore has a varying potential. ACG is grounded. The read transistor is turned on since PT and WLR are high, which provides a relatively high voltage (10 volts) to the tunneling drain 200. Since the floating gate 340 is at a low voltage, a potential is created between the floating gate 340 and the tunneling drain 200 so that electrons tunnel from the floating gate 340 to the tunneling drain 200 through the edge 121 of the tunneling drain 200. The erase operation, in this embodiment, is done in bulk (multiple cells are erased at one time), while the program operation is selective to certain cells.

The EEPROM cell 100 has numerous advantages over previous EEPROM cells. First, the EEPROM cell is a two transistor device rather than a three transistor device which provides significant size improvements over prior art devices. Likewise, only two oxide regions 240,320 are formed, rather than three such regions in a three transistor device, which simplifies the manufacturing process. Second, the areas in which the erase and program operations occur are not the same exact area of the EEPROM cell. One operation (program) is performed by electron tunneling at the edge 121 of the tunneling drain 200 from the floating gate 340. The other operation (erase) is performed across the entire portion of the tunneling channel 230. While there is some overlap between these two areas, the EEPROM cell has improved reliability since a larger area is used for erasing (entire tunnel channel 210) while a smaller area (edge 121) is used for programming, and not the same exact area is used for both operations. By tunneling across the tunneling channel 230, the reliability of the EEPROM cell is increased since a larger oxide area is used for erasing operations. Thus, by using the entire channel, reliability of the EEPROM device increases since the entire oxide layer is used rather than only an edge of an oxide layer. The EEPROM cell of FIG. 1 further has the advantage of having thinner oxide layers 240, 250, 315 which decreases the cell size. Prior art devices had oxide layer thicknesses in excess of 150 angstroms while the present oxide layers are in the range of 80 to 150 angstroms. Additionally, the present EEPROM cell 100 does not perform the electron tunneling through the PRJ and therefore the tunnel oxide quality is not degraded which provides better cell data retention. Thirdly, the scaling of the tunnel oxide regions from 96 to 80 angstroms means that $V_{pp}$ may also be scaled down which provides an EEPROM cell that operates at lower power. The EEPROM cell further has a reduced third oxide thickness in the periphery of an integrated circuit containing the EEPROM cell of the present invention that further lowers the voltages needed to operate the integrated circuit.

The EEPROM cell 100 of FIG. 1 is read by determining the state of tunneling transistor 120. In one embodiment, the tunneling transistor 120 is a depletion mode transistor in which ACG and PTG are grounded, WLR and PT are set to $V_{cc}$, for example 3.3 volts. If the tunneling transistor 120 is an enhancement mode transistor, ACG is set to $V_{cc}$, for example 3.3 volts, while the remaining voltages remain the same. Thus, the state of tunneling transistor 120 is a logical 1 during program since a positive charge is on floating gate 340 while a logical 0 is the state of tunneling transistor 120 during erase. The tunneling transistor 120 reads a logical 1 if current flows from tunneling source 190 to tunneling drain 200. If no current flows, a logical 0 results.

Figure 2:
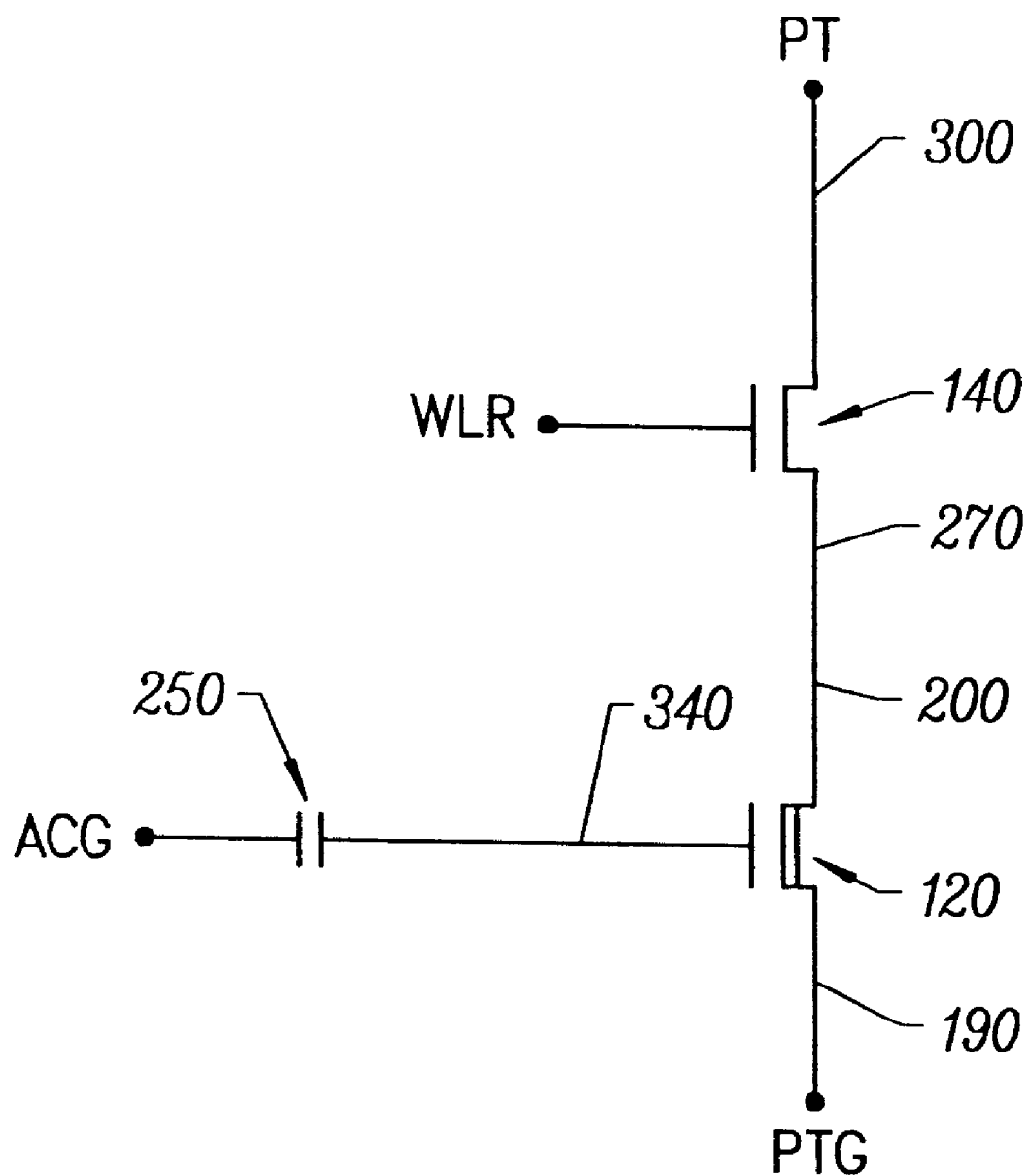
FIG. 2 is a circuit diagram view of an embodiment of the EEPROM cell of the present invention.

FIG. 2 is a circuit diagram view of the embodiment of the EEPROM cell of FIG. 1. In FIG. 2, the two transistors of FIG. 1 including the tunneling transistor 120 and the read transistor 140 are shown. The tunneling transistor 120 is shown to be capacitively coupled to ACG through the program junction region 250. The tunneling source 190 is electrically connected to PTG and the read drain 300 is electrically connected to PT. The read transistor 140 and the tunneling transistor 120 share the tunneling drain 200 and the read source 270. The read transistor is electrically connected to WLR while the floating gate 340 of the tunneling transistor is capacitively coupled to the program junction region 250.

The EEPROM cell of the present invention has been described in connection with the embodiments disclosed herein. Although an embodiment of the present invention has been shown and described in detail, along with variances thereof, many other varied embodiments that incorporate the teachings of the invention may be easily constructed by those skilled in the art that may fall within the scope of the present invention as claimed below.

What is claimed is:
1. An EEPROM cell, comprising:
   a semiconductor substrate, said semiconductor substrate having a first conductivity type;
   a tunneling transistor formed in said semiconductor substrate, said tunneling transistor having a tunneling source, a tunneling drain and a tunneling channel between said tunneling source and said tunneling drain, said tunneling drain and said tunneling source having a second conductivity type that is opposite said first conductivity type;
   a tunnel oxide layer overlying said tunneling channel, said tunneling source and said tunneling drain;
   a program junction region formed in said semiconductor substrate, said program junction region separated from said tunneling transistor by a field oxide region, said program junction region having said second conductivity type;

a program junction oxide layer overlying said program junction region;

a read transistor formed in said semiconductor substrate, said read transistor having a read source, a read drain and a read channel between said read source and said read drain, said read transistor electrically connected to said tunneling transistor through said read source, said read source and said read drain having said second conductivity type; and a floating gate overlying said tunnel oxide layer and said program junction oxide layer.

2. The EEPROM cell of claim 1, wherein said first conductivity type is a P type conductivity.

3. The EEPROM cell of claim 2, wherein said second conductivity type is an N type conductivity.

4. The EEPROM cell of claim 1, wherein electron tunneling through said tunnel oxide layer overlying said tunneling channel occurs upon incurrence of a sufficient voltage potential between said floating gate and said tunneling channel.

5. The EEPROM cell of claim 4, wherein said electron tunneling through said tunnel oxide layer overlying said tunneling channel occurs across an entire portion of said tunneling channel.

6. The EEPROM cell of claim 4, wherein said electron tunneling through said tunnel oxide layer erases said EEPROM cell.

7. The EEPROM cell of claim 1, wherein electron tunneling through said tunnel oxide layer overlying an edge of said tunneling drain occurs upon occurrence of a sufficient voltage potential between said floating gate and said tunneling drain.

8. The EEPROM cell of claim 7, wherein said electron tunneling through said tunnel oxide layer programs said EEPROM cell.

9. The EEPROM cell of claim 1, further comprising:

an array control ground (ACG) electrically connected to said program junction region;

a product term ground (PTG) electrically connected to said tunneling source;

a product term (PT) electrically connected to said read drain; and a word line read (WLR) electrically connected to said read transistor.

10. The EEPROM cell of claim 9, wherein said ACG, PTG, PT and WLR provide a sufficient voltage potential between said floating gate and said tunneling channel by providing approximately 12 volts to said ACG, approximately 0 volts to said PTG and said PT, and approximately 3.3 volts to said WLR.

11. The EEPROM cell of claim 9, wherein said ACG, PTG, PT and WLR provide a sufficient voltage potential between said floating gate and said tunneling drain by providing approximately 12 volts to said WLR, approximately 10 volts to said PT, approximately 0 volts to said ACG and a floating voltage to said PTG.

12. The EEPROM cell of claim 9, wherein a current flows between said tunneling source and said tunneling drain when said PTG is provided approximately 0 volts and said WLR, said PT and said ACG are provided approximately 3.3 volts.

13. The EEPROM cell of claim 12, wherein said tunneling transistor is an enhancement mode transistor.

14. The EEPROM cell of claim 9, wherein a current flows between said tunneling source and said tunneling drain when said ACG and said PTG are provided approximately 0 volts and said WLR and said PT are provided approximately 3.3 volts.

15. The EEPROM cell of claim 14, wherein said tunneling transistor is a depletion mode transistor.

16. The EEPROM cell of claim 1, wherein said tunnel oxide layer has a thickness of approximately 80 angstroms.

17. The EEPROM cell of claim 1, wherein said program junction oxide layer has a thickness of approximately 96 angstroms.

18. The EEPROM cell of claim 1, wherein said read transistor has a read gate oxide layer overlying said read channel, said read gate oxide layer having a thickness of approximately 150 angstroms.

19. An EEPROM cell, comprising:

a semiconductor substrate, said semiconductor substrate having a P conductivity type;

a tunneling transistor formed in said semiconductor substrate, said tunneling transistor having a tunneling source, a tunneling drain and a tunneling channel between said tunneling source and said tunneling drain, said tunneling drain and said tunneling source having an N conductivity type, said tunneling source electrically connected to a product term ground;

a tunnel oxide layer overlying said tunneling channel, said tunneling source and said tunneling drain;

a program junction region formed in said semiconductor substrate, said program junction region separated from said tunneling transistor by a field oxide region, said program junction region having said N conductivity type, said program junction region electrically connected to an array control ground;

a program junction oxide layer overlying said program junction region;

a read transistor formed in said semiconductor substrate, said read transistor having a read source and a read drain and a read channel between said read source and said read drain, said read transistor electrically connected to said tunneling transistor through said read source, said read source and said read drain having said N conductivity type, said read drain electrically connected to a product term and said read transistor electrically connected to a word line read; and a floating gate overlying said tunnel oxide layer and said program junction oxide layer.

* * * * *